Figures 1, 3:
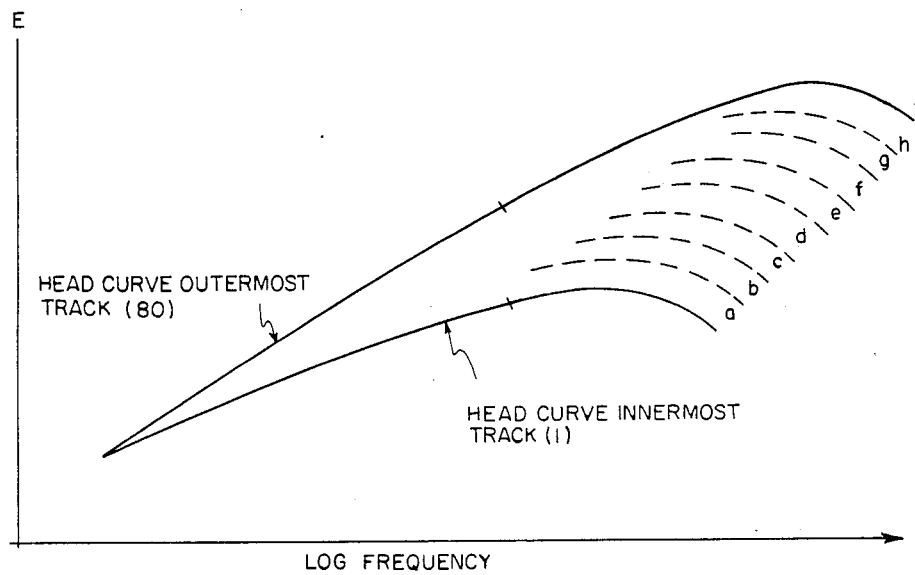

United States Patent [19]

Baumeister

[11] Patent Number: 4,564,869
[45] Date of Patent: Jan. 14, 1986

[54] ZONED EQUALIZATION FOR A MAGNETIC DISC

[75] Inventor: Hans-Peter Baumeister, Churchville, N.Y.

[73] Assignee: Eastman Kodak Company, Rochester, N.Y.

[21] Appl. No.: 553,894

[22] Filed: Nov. 21, 1983

[51] Int. Cl.$^4$ .......................... G11B 5/09; G11B 5/45
[52] U.S. Cl. ......................................... 360/46; 360/65
[58] Field of Search ............................. 360/65, 46, 67

[56] References Cited

U.S. PATENT DOCUMENTS

| | | | |
|---|---|---|---|
| 2,901,737 | 8/1959 | Stovall, Jr. ............................. | 360/65 |
| 4,314,287 | 2/1982 | Freeman et al. ....................... | 360/67 |
| 4,314,289 | 2/1982 | Haynes ................................... | 360/65 |
| 4,479,152 | 10/1984 | Chi ......................................... | 360/65 |

Primary Examiner—Vincent P. Canney
Attorney, Agent, or Firm—Robert F. Cody

[57] ABSTRACT

Because the lineal speed of a pre-recorded disc relative to a playback head depends on the radial position of the head with respect to the disc, the present invention calls for equalization that correspondingly varies as a function of the radial position of the playback head. Since the recorded tracks of the disc reside in a relatively narrow band about the disc—and because of the relatively large number of tracks within such band—an additional concept of the invention is to divide the band into head-position zones—each such zone corresponding to a different grouping of recorded tracks—and to employ equalization that is respective of the specified zones.

7 Claims, 3 Drawing Figures

| ZONE | HEAD CURVES FOR TRACKS | EQUALIZATION WEIGHTING CONSTANTS |
|---|---|---|
| a | 1 - 10 | $A^0$ |
| b | 11 - 20 | $A^1$ |
| c | 21 - 30 | $A^2$ |
| d | 31 - 40 | $A^3$ |
| e | 41 - 50 | $A^4$ |
| f | 51 - 60 | $A^5$ |
| g | 61 - 70 | $A^6$ |
| h | 71 - 80 | $A^7$ |

ZONED EQUALIZATION FOR A MAGNETIC DISC

BACKGROUND OF THE INVENTION

1. Field of the Invention

This invention relates in general to magnetic recording apparatus and, in particular, to apparatus for use in the playback of information recorded on a magnetic disc.

2. Description Relative to the Prior Art

It is well known in the field of magnetic recording to employ what are called equalization circuits. Equalization, as employed in the playback of magnetically recorded information, serves to correct playback inequities which stem from the fact that playback signal processing is, in general, frequency dependent: With a typical inductive playback head that is dependent on recorded signal flux rate of change, the playback voltage-versus-log frequency response curve rises with frequency, only to fall off eventually as the playback wavelength approaches the gap length of the playback magnetic head. Further, because the inductive reactance of the aforenoted head is frequency dependent (i.e. $X_L = 2\pi fL$), differing signal delays inherently become associated with the various signal components which comprise, say, a recorded pulse that is played back by means of such head; these differing signal delays manifest themselves as phase disparities among the various signal components which comprise the played back pulse. To effect a flattened, or otherwise shaped, voltage-versus-log frequency curve, amplitude equalization is employed, whereby (typically) lower and higher signal frequencies receive more gain than mid-range signal frequencies; to bring the various signal frequency components which comprise a played back signal into proper phase relationship with respect to each other, frequency dependent phase equalization is employed.

In variable speed magnetic tape recorders, it is known to vary the degree of equalization as a function of tape speed: At one tape speed, the equalization would be set one way; at any other tape speed, the equalization would be set another way. Lowman, in his text "Magnetic Recording", McGraw-Hill Book Company, pg. 178, describes such a variable equalization circuit in which "speed gates" select one or another pair of gain and time delay circuits, depending on which of six recorder tape speeds is employed.

Currently, there appears in the literature various disclosures for an electronic still camera in which a magnetic disc is spun at relatively high speed in relation to a record head within the camera. As each picture is "snapped", an encoded video signal is recorded in a respective (or grouping of) circular track(s) about the rotary axis of the disc. The disc, therefore, ultimately comprises a plurality of recorded tracks . . . and these, incidentally, reside in a relatively narrow band around the disc. Typically, there would be upwards of eighty video tracks per disc. During playback of video information recorded on such a disc, a playback head is positioned respective of the track whose encoded picture is to be displayed. (While the invention, as will appear below, is cast in the environment of an 80-track "video" disc, it is not so limited and may, if appropriate, be accommodated to digital and other forms of analog recording.)

Other art which may be germane to the present invention may be found in:

| U.S. Pat. No. | Title | Date |
| --- | --- | --- |
| 2,247,924 | Automatic Equalizing System For Recording On Disk Records | 7/1/41 |
| 3,430,215 | Automatic Gain Level Stepping System | 2/25/69 |
| 3,944,754 | Record Disc Recording System With Signal Amplitude Controlled By Stylus Arm Position | 3/16/76 |
| 4,170,022 | Apparatus And Process For Recording With Variable Correction Of A Television Signal Having Three Components | 10/2/79 |

SUMMARY OF THE INVENTION

Because the lineal speed of a pre-recorded disc relative to a playback head depends on the radial position of the head with respect to the disc, the present invention calls for equalization that correspondingly varies as a function of the radial position of the playback head. Since the recorded tracks of the aforedescribed disc reside in a relatively narrow band about the disc—and because of the relatively large number of tracks within such band—an additional concept of the invention is to divide the band into head-position zones—each such zone corresponding to a different grouping of recorded tracks—and to employ equalization that is respective of the specified zones. Such a concept is viable because of the close proximity of the adjacent tracks to each other (i.e. there is little difference between the requisite equalizations associated with closely spaced tracks), despite the fact that tracks in different zones may be sufficiently far apart to require different amounts of equalization. Attendant upon such an equalization strategy is the economy of avoiding (in connection with the disc in question), eighty separate equalization arrangements for each of the recorded disc tracks.

The invention will now be described with reference to the figures of which

Figure 2:
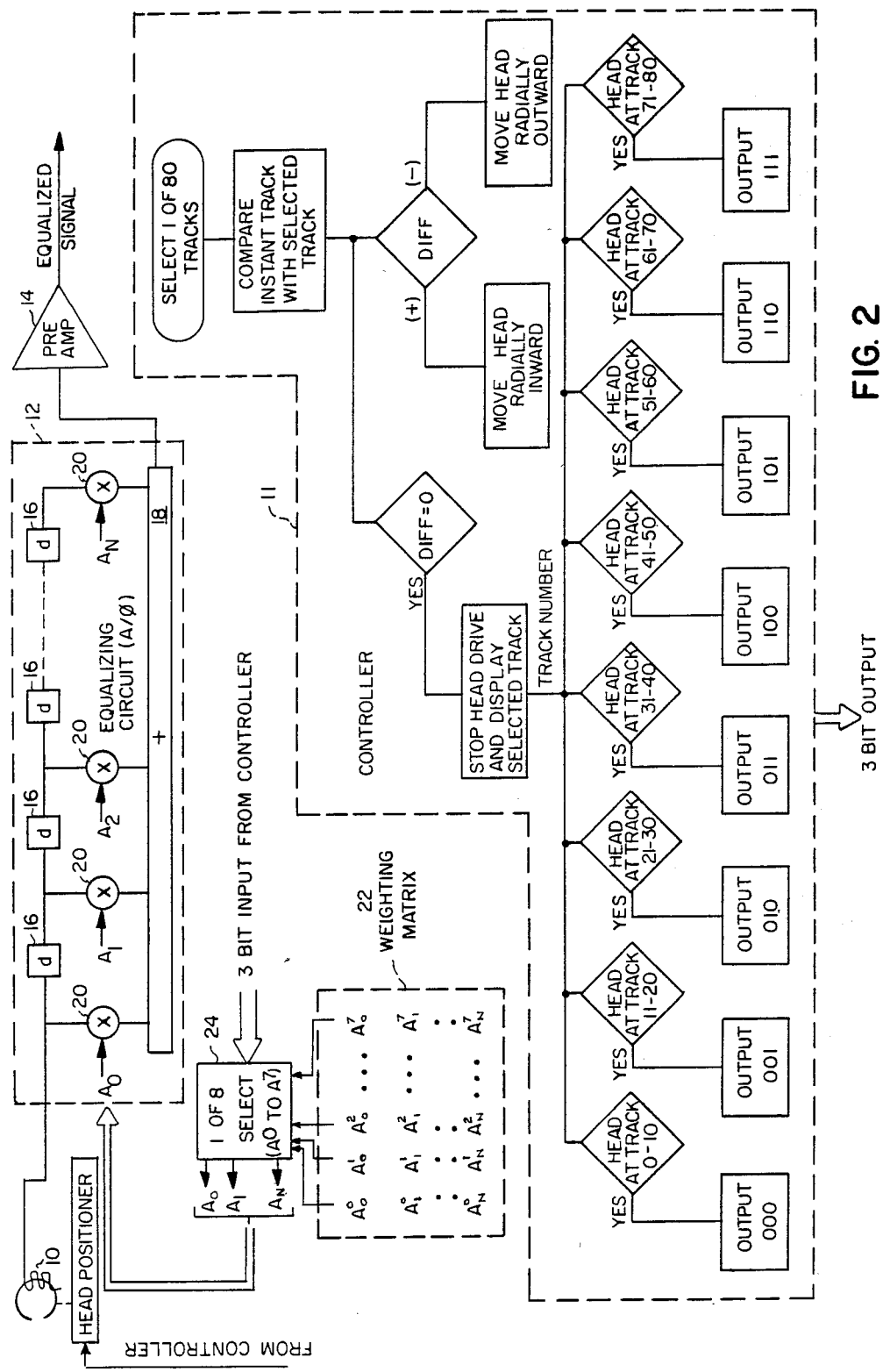

FIG. 1 illustraltes head curves which reflect concepts embodied by the invention, FIG. 2 is a system block diagram of playback apparatus according to the invention, and FIG. 3 indicates a table illustrating weighting constants for the apparatus of FIG. 2.

Referring to FIG. 1, the voltage-versus-log frequency response curves for a playback head cooperating with an 80-track rotary disc span a range of zones which have been labeled a through h. The innermost track of the disc (lowest lineal speed) exhibits the lowest output, and lowest bandedge frequency; contrarily, the outermost track (greatest lineal speed) exhibits greatest output, and greatest bandedge frequency. Rather than provide respective amplitude and phase equalization for each of the eighty tracks, the invention (as noted above) provides equalization respective of zones . . . not tracks . . . thereby to provide playback uniformity that is substantially independent of the selected-track head position. With the showing of FIG. 1 in mind, then, reference should be had to FIG. 2:

A playback head 10—positionable to one of eighty video tracks of a magnetically recorded disc, depending on the command of a controller 11—applies its output signal to an equalizing circuit 12, and thence to a preamplifier 14. The equalizing circuit 12, which effects both amplitude and phase equalization, constitutes a transversal filter. Although transversal filters can take a variety of forms, a filter such as that described in "Modern Filter Theory and Design", Temes and Mitra, John Wiley and Sons, pg. 508, is indicated for the practice of the invention: The filter comprises a number of discrete signal delay element 16, and an output summing device 18 adapted to receive the "qualified" input and output of the delay elements 16 . . . thereby to form an equalized "sum-signal" version of the signal output of the playback head 10. To modify the filter 12 characteristics, the input signal to, and the output signal from, the delay elements 16 are (before being summed) "qualified" by weighting constants $A_o$ to $A_N$ . . . such constants being respectively applied to multipliers 20 along with the delay element input and output signals. Attendantly, the product signals appearing at the outputs of the multipliers 20 serve (as they are summed) to form an equalized "sum-signal" that is customized according to the weighting constants $A_o$ to $A_N$.

In accordance with the invention, respective sets of weighting constants $A^o$ to $A^7$, corresponding to the "zoned" track-related response curves a through h (See FIG. 3), are stored in a memory matrix 22, which may take the form of a read-only-memory (ROM). Depending on the binary count of a 3-bit input to a 1-of-8 decoding circuit 24 (which may take any of a variety of well known forms), one or another of the eight sets ($A^o$ to $A^7$) of weighting constants is applied to the respective multipliers 20 of the equalizing circuit 12, thereby to customize the equalization provided by the circuit 12 in accordance with the selected set of weighting constants.

The controller 11, which may take the form of a microprocessor such as the TMS 1000, available from Texas Instruments, is functionally indicated in FIG. 2 by the state-of-the-art manner in which such microprocessor is programmed for operation: In general, a person operating a disc player incorporating the invention selects a given track. After an in-processor comparison between the instant track location occupied by the positionable head 10 and the given track, the controller 11 positions the head 10—one way or the other—pursuant to such comparison. Should the selected and instant track locations be the same, the controller produces a 3-bit binary count depending on which of eight 10-track zones contains the selected track . . . and it is this 3-bit count which serves to select (24) the particular set of equalizing circuit weighting constants that corresponds to the selected track. Attendantly, the operation of the equalizing is customized for the selected track.

The invention has been described in detail with particular reference to certain preferred embodiments thereof, but it will be understood that variations and modifications can be effected within the spirit and scope of the invention. While the aforedescribed apparatus and the concept which it embodies are directed to the playback side of a recorder, it is also within the purview of the invention to qualify the record side of a recorder so as to practice the inventon. For example, assuming the aforesaid eighty tracks are bias-recorded, amplitude and phase equalization (respective of zoned tracks) may be impressed upon signals as they are recorded in such tracks.

What is claimed is:

1. Apparatus for use with a rotatable magnetic recording disc of the type disposed to have information magnetically recorded about the rotary axis of said disc, said apparatus comprising:
   (a) means for rotating said magnetic disc about the rotary axis thereof,
   (b) magnetic head means cooperative with said disc for Processing signals to or from said disc,
   (c) means for positioning said magnetic head means from one radial position relative to the rotary axis of said disc to another radial position relative to said rotary axis,
   (d) equalizer means for modifying said signals, and
   (e) means cooperative with said means for positioning said magnetic head means for altering the operation of said equalizer means as a function of the radial distance of said head from the rotary axis of said disc, said magnetic head means being a playback head, and said means for altering the operation of said equalizer means comprising:
   (a) means for separating the radial positions of said head into zoned positions thereof, and
   (b) means for incrementally altering the operation of said equalizer means in accordance with the zoned positions of said head, said equalizer means being a transversal filter, and said apparatus further comprising:
   (a) means for providing a plurality of groupings of weighting constants for said filter, and
   (b) means for selectively applying said groupings of weighting constants to said filter respective of said zoned positions.

2. Apparatus for use with a rotatable magnetic recording disc of the type disposed to have information magnetically recorded about the rotary axis of said disc, said apparatus comprising:
   (a) means for rotating said magnetic disc about the rotary axis thereof,
   (b) magnetic head means cooperative with said disc for processing signals to or from said disc,
   (c) means for positioning said magnetic head means from one radial position relative to the rotary axis of said disc to another radial position relative to said rotary axis,
   (d) equalizer means for modifying said signals, and
   (e) means cooperative with said means for positioning said magnetic head means for altering the operation of said equalizer means as a function of the radial distance of said head from the rotary axis of said disc, said equalizer means including means for effecting both phase and amplitude equalization of playback signals derived from said disc, and
   said equalizer means being a transversal filter, and said apparatus further comprising:
   (a) means for providing a plurality of groupings of weighting constants for said filter, and
   (b) means for selectively applying said groupings of weighting constants to said filter respective of said zoned positions.

3. Apparatus for the playback of information recorded on a magnetic disc in a plurality of generally circular tracks disposed about the rotary axis of said disc, said apparatus comprising:
   (a) magnetic head means, (b) means for selectively positioning said magnetic head means for the playback of information recorded in a given track of said disc,
(c) equalizer means for receiving and modifying signals played back by means of said magnetic head means, and
(d) means responsive to said means for selectively positioning said magnetic head means and cooperative with said equalizer means for varying the operation of said equalizer means in relation to the selected position for said magnetic head means,
increments of travel of said magnetic head means corresponding to respective plural-track zones of said disc, and said means for varying the operation of said equalizer means including means for varying said operation respective of said zones, said equalizer means being of the type that effects both phase and amplitude equalization,
said equalizer means being comprised of a transversal filter, and said means for varying the operation of said equalizer means comprising:
(a) means for storing a plurality of groups of weighting constants for said transversal filter, and
(b) means for selectively applying one or another group of weighting constants to said transversal filter respective of the zoned positions of said magnetic head means.

4. The apparatus of claim 3 wherein said means for selectively applying weighting constants to said transversal filter is a microprocessor.

5. Magnetic disc playback apparatus, data recorded on said disc being disposed in zones of generally circular tracks about the rotary axis of said disc, each said zone having a plurality of tracks therein, said apparatus comprising:
(a) a magnetic head of the type that is responsive to flux rate of change,
(b) means for positioning said magnetic head to a given track of said disc for the playback thereby of signals recorded in said given track,
(c) equalizer means cooperative to receive signals played back by said magnetic head for modifying said signals, and
(d) means for modifying the operation of said equalizer means respective of the zone containing the given track that is productive of said signals played back by means of said magnetic head,
said equalizer means being comprised of a transversal filter, and said means for modifying the operation of said equalizer means comprising:
(a) means for storing a plurality of groups of weighting constants for said transversal filter, and
(b) means for selectively applying one or another group of weighting constants to said transversal filter respective of the zone that contains the given track that is productive of the signals played back by means of said magnetic head.

6. The apparatus of claim 5 wherein said equalizer means is of the type that effects both phase and amplitude equalization.

7. The apparatus of claim 6 wherein said means for selectively applying weighting constants to said transversal filter is a microprocessor.

* * * * *